(12) United States Patent
Irvin et al.

(10) Patent No.: US 6,896,723 B2
(45) Date of Patent: May 24, 2005

(54) COMPRESSED FLUID FORMULATION CONTAINING HOLE TRANSPORTING MATERIAL

(75) Inventors: Glen C. Irvin, Rochester, NY (US); Ramesh Jagannathan, Rochester, NY (US); Seshadri Jagannathan, Pittsford, NY (US); Rajesh V. Mehta, Rochester, NY (US); Sridhar Sadasivan, Rochester, NY (US); Ross A. Sprout, Rochester, NY (US); Tin T. Vo, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 26 days.

(21) Appl. No.: 10/313,564

(22) Filed: Dec. 6, 2002

(65) Prior Publication Data

US 2004/0110866 A1 Jun. 10, 2004

(51) Int. Cl.[7] .............................................. C09D 11/00
(52) U.S. Cl. ................... 106/31.43; 106/31.75; 106/31.33; 106/31.65; 106/31.32; 106/31.64; 106/31.57; 106/31.85
(58) Field of Search .................... 106/31.43, 31.75, 106/31.33, 31.65, 31.32, 31.64, 31.57, 31.85, 31.27, 31.6, 31.88

(56) References Cited

U.S. PATENT DOCUMENTS

| | | | |
|---|---|---|---|
| 3,172,862 A | 3/1965 | Gurnee et al. ......... 252/301.16 |
| 3,173,050 A | 3/1965 | Gurnee ..................... 313/504 |
| 3,710,167 A | 1/1973 | Dresner et al. ............ 313/504 |
| 4,356,429 A | 10/1982 | Tang ......................... 313/503 |
| 4,734,227 A | 3/1988 | Smith .......................... 264/13 |
| 4,769,292 A | 9/1988 | Tang et al. ................. 428/690 |
| 5,312,862 A * | 5/1994 | Nielsen et al. ............. 524/552 |
| 5,851,709 A | 12/1998 | Grande et al. ................ 430/7 |
| 5,869,350 A | 2/1999 | Heeger et al. ............... 438/29 |
| 5,972,419 A | 10/1999 | Roitman ...................... 427/66 |
| 6,116,718 A | 9/2000 | Peeters et al. ............... 347/21 |
| 6,471,327 B2 * | 10/2002 | Jagannathan et al. ......... 347/21 |
| 6,595,630 B2 * | 7/2003 | Jagannathan et al. ......... 347/85 |
| 6,695,980 B2 * | 2/2004 | Irvin et al. ............. 252/301.16 |
| 2002/0118246 A1 * | 8/2002 | Jagannathan et al. ......... 347/21 |
| 2002/0187272 A1 * | 12/2002 | Kojima et al. .............. 427/421 |
| 2003/0030706 A1 * | 2/2003 | Jagannathan et al. ......... 347/85 |
| 2004/0007154 A1 * | 1/2004 | Irvin et al. ............... 106/31.13 |

FOREIGN PATENT DOCUMENTS

WO        02/45868        6/2002

OTHER PUBLICATIONS

Tang et al; "Electroluminescence Of Doped Organic Thin Films"; J. Applied Physics; 65 (9); May 1, 1989; pp. 3610–3616.

Dresner; "Double Injection Electroluminescence In Anthracene"; RCA Review; vol. 30; pp. 322–334; Jun. 1969.

* cited by examiner

*Primary Examiner*—Helene Klemanski
(74) *Attorney, Agent, or Firm*—Paul A. Leipold

(57) ABSTRACT

An imaging composition comprising a mixture of a solvent and a functional material; wherein the solvent is a compressed fluid and the functional material is a hole transporting material which is dissolved, dispersed and/or solubilized in the compressed fluid; wherein the mixture is thermodynamically stable or thermodynamically metastable or both; wherein the functional material is solvent-free upon deposition on a substrate; and wherein the functional material forms a solid film upon deposition on the substrate.

26 Claims, 2 Drawing Sheets

COMPRESSED FLUID FORMULATION CONTAINING HOLE TRANSPORTING MATERIAL

CROSS-REFERENCE TO RELATED APPLICATIONS

This application relates to commonly assigned copending application Ser. Nos. 10/313,259; 10/313,617, and 10/313,426 all filed Dec. 6. 2002. The copending applications are incorporated by reference herein for all that they contain.

FIELD OF THE INVENTION

This invention relates generally to imaging compositions that contain functional materials, more specifically, hole transporting materials that are dissolved, dispersed and/or solubilized in a fluid that is in a compressed state. The compositions are used to create a high-resolution pattern or image onto a substrate for imaging and display applications.

BACKGROUND OF THE INVENTION

Organic light-emitting diode (OLED) display devices can be classified as either small molecule or polymeric type (sometimes called PLED). Typically, processing of OLED small molecule based devices can be very difficult using vapor deposition processes in conjunction with masking technologies. PLED based device processing has been achieved using various solution based processing techniques and some dry based processing, although with difficulty.

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. The organic layers in these devices, usually composed of a polycyclic aromatic hydrocarbon, were very thick (much greater than 1 $\mu$m). Consequently, operating voltages were very high, often >100V.

More recent organic EL devices include an organic EL element consisting of extremely thin layers (e.g. <1.0 $\mu$m) between the anode and the cathode. Herein, the term "organic EL element" encompasses the layers between the anode and cathode electrodes. Reducing the thickness lowered the resistance of the organic layer and has enabled devices that operate much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al [J. Applied Physics, Vol. 65, Pages 3610–3616, 1989]. The light-emitting layer commonly consists of a host material doped with a guest material. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

Ink jet recording or printing systems are commonly used to create high-resolution patterns on a substrate. In a typical ink jet recording or printing system, ink droplets are ejected from a nozzle towards a recording element or medium to produce an image on the medium. The ink droplets, or recording liquid, generally comprise a functional material or functional material, such as a dye or pigment or polymer, and a large amount of solvent. In conventional inkjet printing systems, the liquid ink droplets are ejected from the nozzle using pressure pulses generated by an oscillating piezoelectric crystal or by heating the nozzle to generate an ink droplet resulting from bubble formation or from ink phase change. The solvent, or carrier liquid, typically is made up of water, an organic material such as a monohydric alcohol, a polyhydric alcohol or mixtures thereof. There can be many additives in the system aimed at preserving the pixel integrity upon deposition to the receiver. Such materials may be surfactants, humectants, biocides, rheology modifiers, sequestrants, pH adjusters, and penetrants among others. Such materials are necessary due to the high solvent loads in conventional ink formulations. More recently, the inkjet printing method has been used to make electroluminescent display devices.

U.S. Pat. No. 5,972,419 discloses a method of making a multicolor display device, comprising a transparent substrate, electroluminescent materials deposited via an inkjet printing mechanism into wells that are defined by masks produced via a lithographic technique. There is a problem with this invention in that the inkjet printing compositions which contain electroluminescent materials have high solvent loads to be used in conventional ink jet printers. These solvents typically are toxic, for example xylene. Also the substrate needs to be dried after printing to remove the solvent, thereby increasing the manufacturing time. Further, due to solvent content, there is a necessity to have masks fabricated to produce the array of pixels, which increases process time and complexity potentially decreasing device yield. These masks are necessary so that the deposited liquid containing electroluminescent material solutions from adjacent pixels do not contact each other.

U.S. Pat. No. 5,869,350 discloses a method of making a light emitting diode, comprising a glass substrate, where an electroluminescent material is spin-coated onto the substrate using a 1 wt % electroluminescent polymer-tetrahydrofuran solution. There is a problem with this invention in that the spin-cast technique uses very high solvent loads requiring removal of toxic organic solvents. Also, with systems containing low solids weight percent in liquid solutions, a significant dry time is necessary which can increase manufacturing time. Further, to make full color displays, it would be necessary to use masks to produce pixels of various colors thereby increasing process complexity and potentially decreasing device yield. Moreover, spin coating techniques tends to produce films with varying thickness along the length of the device, which is unacceptable.

U.S. Pat. No. 5,851,709 discloses a method to produce electroluminescent displays by providing a suitable substrate, and donor sheets that contain organic light emissive materials. A device is used to transfer the organic light emissive materials onto the substrate in pixel patterns in order to form the display. There is a problem with this technology in that the donor sheet can be complex consisting of several layers and must be fabricated prior to the transfer step therefore adding additional steps to the manufacturing process. Also, handling of the donor sheet is difficult because water may degrade or adsorb into the layers potentially causing process difficulties. Further, the transfer device typically uses a laser that heats a portion of the donor sheet in order to transfer the organic light emissive material potentially causing material degradation due to high temperatures at the point of irradiation. Also, the donor sheet must be affixed in registered, close proximity to the substrate to produce the appropriate pixels increasing the processing complexity.

There are alternate technologies that are available in the prior art, that eliminate this problem by using gaseous propellants. For example, Peeters et al., in U.S. Pat. No. 6,116,718, disclose a print head for use in a marking apparatus in which a propellant gas is passed through a channel, the functional material is introduced controllably into the propellant stream to form a ballistic aerosol for propelling non-colloidal, solid or semi-solid particulate or a liquid, toward a receiver with sufficient kinetic energy to fuse the marking material to the receiver. There is a problem with this technology in that the functional material and propellant stream are two different entities and the propellant is used to impart kinetic energy to the functional material. This can cause functional material agglomeration leading to nozzle obstruction and poor control over functional material deposition. Another problem with this technology is that when the functional material is added into the propellant stream in the channel it forms a non-colloidal ballistic aerosol prior to exiting the print head. This non-colloidal ballistic aerosol, which is a combination of the functional material and the propellant, is not thermodynamically stable. As such, the functional material is prone to settling in the propellant stream, which in turn, can cause functional material agglomeration leading to nozzle obstruction and poor control over functional material deposition.

Technologies that use supercritical fluid solvents to create thin films are also known. For example, R. D. Smith in U.S. Pat. No. 4,734,227, issued Mar. 29, 1988, discloses a method of depositing solid films or creating fine powders through the dissolution of a solid material into a supercritical fluid solution and then rapidly expanding the solution to create particles of the functional material in the form of fine powders or long thin fibers which may be used to make films. There is a problem with this method in that the free-jet expansion of the supercritical fluid solution results in a non-collimated/defocused spray that cannot be used to create high-resolution patterns on a receiver. Further, defocusing leads to losses of the functional material.

Huck et al., in WO 02/45868 A2, discloses a method of creating a pattern on a surface of a wafer using compressed carbon dioxide. The method includes dissolving or suspending a material in a solvent phase containing compressed carbon dioxide, and depositing the solution or suspension onto the surface of the wafer, the evaporation of the solvent phase leaving a patterned deposit of the material. The wafer is prepatterned using lithography to provide the wafer with hydrophilic and hydrophobic areas. After deposition of the solution (or suspension) onto the wafer surface followed by the evaporation of the solvent phase, the material (a polymer) adheres to one of the hydrophobic and hydrophilic areas. The solution (or suspension) is deposited on the wafer surface either in the form of liquid drops or a feathered spray.

This method is disadvantaged because deposition using a feathered spray requires that the wafer surface be prepatterned prior to deposition. Hence, direct patterning of the wafer surface is not possible because of the diverging profile (feathered) of the spray. Additionally, a wafer surface that has not been prepatterned cannot be patterned using this method. This method also requires time for drying so that the solvent phase of the liquid drops (or feathered spray) can evaporate. During the time associated with solvent phase evaporation, the solvent and the material can diffuse from one pixel to next (for example, into the surface or along the surface) degrading the desired pattern.

A different approach for creating high-resolution patterns is needed. A technique that eliminates the issues with solvent management would be advantageous. There is also a need for a technology that permits high speed, accurate, and precise deposition of a functional material, more specifically, hole transporting material on a substrate to create display devices. There is also a need for a technology that permits high speed, accurate, and precise patterning of a substrate that can be used to create high-resolution patterns on a receiver to form electroluminescent displays. There is also a need for formulations that permit high speed, accurate and precise deposition of a functional material, more specifically, electroluminescent polymeric material on a substrate to create imaging and display display devices.

SUMMARY OF THE INVENTION

The present invention overcomes the problems discussed above by providing an imaging composition comprising a mixture of a fluid and a functional material, more specifically hole transporting material. The fluid is compressed and the functional material is dissolved, dispersed and/or solubilized in the compressed fluid. The mixture is thermodynamically stable or thermodynamically metastable or both. The invention is useful for making organic light emitting diodes for display applications.

The present invention provides advantages by depositing functional material from the formulation in a manner such that it is solvent-free upon deposition and a solid film is created upon deposition.

BRIEF DESCRIPTION OF THE DRAWINGS

In the detailed description of the preferred embodiments of the invention presented below, reference is made to the accompanying drawings.

DETAILED DESCRIPTION OF THE INVENTION

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs). The invention composition is capable of forming an image on a non-prepatterned surface and the invention composition is also capable of forming an image on a pre-patterned surface.

Figure 1:
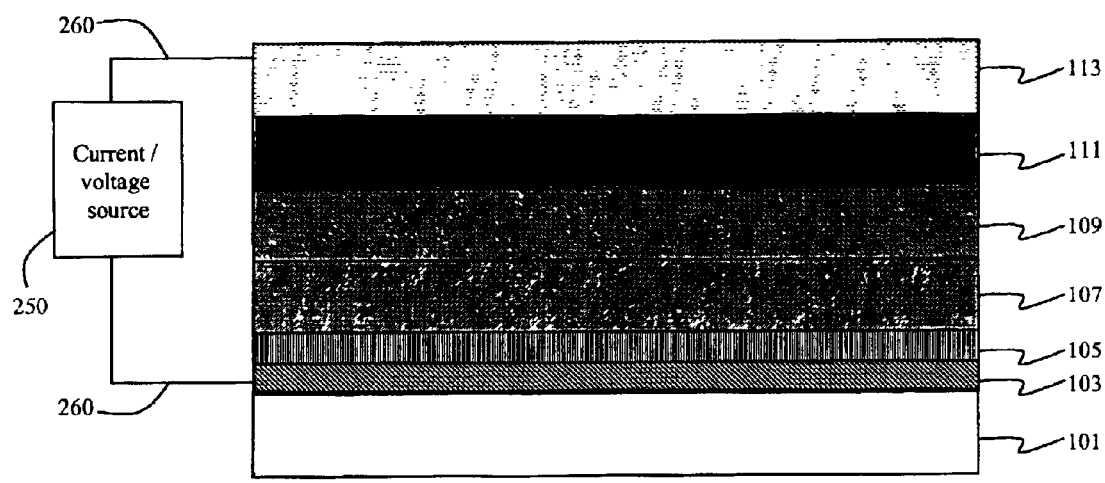
FIG. 1 shows a cross-section of an OLED device of this invention.

There are numerous configurations of the organic layers wherein the present invention can be successfully practiced. A typical structure is shown in FIG. 1 and is comprised of a substrate 101, an anode 103, a hole-injecting layer 105, a hole-transporting layer 107, a light-emitting layer 109, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

The OLED device of this invention is typically provided over a supporting substrate 101 where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

In some instances, layers 109 and 111 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. No. 5,683,823, U.S. Pat. No. 5,503,910, U.S. Pat. No. 5,405,709, and U.S. Pat. No. 5,283,182.

Additional layers such as electron or hole-blocking layers as taught in the art may be employed in devices of this invention. Hole-blocking layers are commonly used to improve efficiency of phosphorescent emitter devices, for example, as in U.S. Application No. 20020015859.

This invention may be used in so-called stacked device architecture, for example, as taught in U.S. Pat. No. 5,703, 436 and U.S. Pat. No. 6,337,492.

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural formula (A).

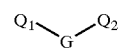

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

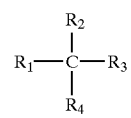

B where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

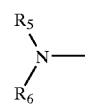

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

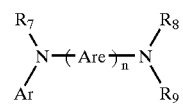

D wherein each Are is an independently selected arylene group, such as a phenylene or anthracene moiety, n is an integer of from 1 to 4, and Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The formulations useful in the present invention contain a functional material, more specifically, hole transporting material such as poly(vinyl carbazole) which is shown Formula I, and tetranapthalenylbiphenyl (TNB) which is shown in Formula II,

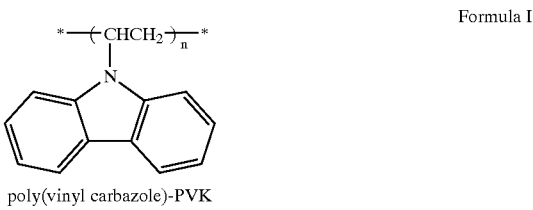

poly(vinyl carbazole)-PVK where n varies from 1–100,000

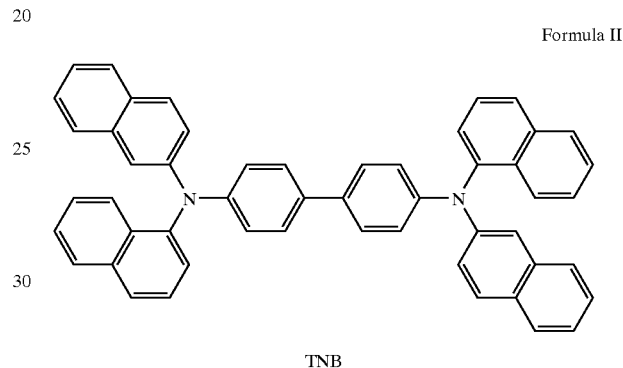

TNB is dissolved, dispersed and/or solubilized, in a compressed fluid. The compressed fluid is any material with a density greater than 0.1 grams/cc. The compressed fluid may include a compressed liquid and/or a supercritical fluid. Materials that are at sufficiently high temperatures and pressures below their critical point are known as compressed liquids. Materials in their supercritical fluid and/or compressed liquid state that exist as gases at ambient conditions find application here because of their unique ability to dissolve, solubilize and/or disperse functional materials, more specifically, hole transporting materials, of interest in the compressed liquid or supercritical state. In this context, the chosen materials taken to a compressed liquid and/or super-critical fluid state are gases at ambient pressure and temperature. Ambient conditions are preferably defined as temperature in the range from −100 to +100° C., and pressure in the range from $1 \times 10^{-8}$–100 atm for this application. More commonly, the ambient conditions are temperature in the range of 0 to 100° C. and pressure in the range from $1 \times 10^{-5}$ to 100 atm. for this application. One skilled in the art should know how to select and maintain the appropriate ambient conditions such that the selected compressed fluid is gas at the ambient conditions.

The compressed fluids include, but are not limited to, carbon dioxide, nitrous oxide, ammonia, xenon, ethane, ethylene, propane, propylene, butane, isobutane, chlorotrifluoromethane, monofluoromethane, sulphur hexafluoride and mixtures thereof. Due its characteristics, e.g. low cost, wide availability, etc., carbon dioxide is generally preferred in many applications.

Functional materials, more specifically, hole transporting materials can be any material that can be delivered to a receiver in the form of a pattern on the receiver to create an electroluminescent device. Such imaging devices could be organic light emitting diode or polymeric light emitting diode devices. These devices could be useful in display applications such as television, cell phone, personal digital assistant, appliance, automobile, signage, lighting, computer, communication, and wall.

The functional materials, more specifically, hole transporting materials may be selected from species that are ionic and/or molecular of the types such as organic, inorganic, metallo-organic, polymeric, oligomeric, metallic, alloy, ceramic, a synthetic and/or natural polymer, and a composite material of those previously mentioned. The functional material, more specifically, electroluminescent material can be a solid or a liquid. The functional material upon deposition would form a solid film. Thus, combinations of solid and liquid precursor materials can combine to form a solid material upon processing using the method described below. Additionally, the functional material, more specifically hole transporting materials can be an organic molecule, a polymer molecule, a metallo-organic molecule, an inorganic molecule, an organic nanoparticle, a polymer nanoparticle, a metallo-organic nanoparticle, an inorganic nanoparticle, an organic microparticles, a polymer micro-particle, a metallo-organic microparticle, an inorganic microparticle, and/or composites of these materials, etc. It may be desirable to have a polymer-inorganic nanoparticle composite that forms the hole transporting layer. After suitable mixing with the compressed fluid the functional material, more specifically hole transporting material, is uniformly distributed within a thermodynamically stable/metastable mixture, to form a dispersion or a solution, with the compressed fluid.

Additionally, the formulation may contain a dispersant and or a surfactant to solubilize and/or disperse the functional material more specifically, an hole transporting material. The dispersant and/or surfactant can be selected from any group that will have appropriate solubility in the compressed liquid and/or supercritical fluid medium as well as have interactions with the functional material so that the functional material can be solubilized. Such materials include, but are not limited to, fluorinated polymers such as perfluoropolyether, siloxane compounds, etc. The surfactants preferred in the invention include Fluorolink 7004® (Ausimont Montedison Group), Formula III, and Fomblin MF-300® (Ausimont Montedison Group), Formula IV, $$Cl(CF_2CF(CF_3)O)_nCF_2COO^-NH_4^+$$

Fluorolink 7004, Ammonium Exchanged

Formula III

Where n Varies from 1–20

Formula IV

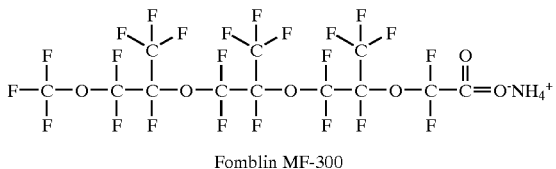

Fomblin MF-300 both of which have headgroups which are ammonium exchanged.

Additionally, the formulation may contain a co-solvent. The co-solvent is chosen such that the hole transporting material is soluble in the co-solvent. The co-solvent is also chosen such that the ternary system of supercritical fluid-polymer-co-solvent is miscible. These co-solvent materials may be chosen from any suitable solvent that meets the criteria previously mentioned.

Additionally, the functional material, more specifically hole transporting materials can be functionalized to dissolve, disperse and/or solubilize the functional material in the compressed fluid. The functionalization may be performed by attaching fluorocarbons, siloxane, and/or hydrocarbon functional groups to the hole transporting material.

Additionally, the ratio of surfactant to functional material in the formulation is from about 0.1:1 to about 500:1, usually 1:1 to 100:1, more preferably 1:1 to 50:1. In another embodiment the ratio of co-solvent to functional material is from about 0.01:1 to about 50:1. In yet another preferred embodiment of the invention, the ratio of co-solvent to functional material in the formulation is from about 0.01:1 to about 100:1, preferably 0.05:1 to 5:1. In still another embodiment of the invention, the ratio of compressed fluid to functional material in the formulation is from about $1:1\times10^{-5}$ to about 1:20, preferably $1:1\times10^{-3}$ to about 1:10.

The compressed fluid forms a continuous phase and the functional material dissolved, dispersed and/or solubilized in the compressed fluid forms a single phase. The formulation is maintained at a temperature and a pressure suitable for the functional material and the compressed fluid used in a particular application. More commonly, the formulation conditions are temperature in the range of 0 to 100° C. and pressure in the range from $1\times10^{-2}$ to 400 atm. for this application.

The method of preparing the formulation will now be discussed. The apparatus used for making the formulation has been disclosed in U.S. Pat. No. 6,752,484, which is a Continuation-in-Part of U.S. Pat. No. 6,471,327, which is incorporated here in its entirety. Briefly, the functional material is controllably introduced into the formulation reservoir. The compressed fluid is also controllably introduced into the formulation reservoir. The contents of the formulation reservoir are suitably mixed using mixing device to ensure intimate contact between the functional material and compressed fluid. As the mixing process proceeds, functional material is solubilized or dispersed within the compressed fluid. The process of dissolution/dispersion, including the amount of functional material and the rate at which the mixing proceeds, depends upon the functional material itself, the particle size and particle size distribution of the functional material (if the functional material is a solid), the compressed fluid used, the temperature, and the pressure within the formulation reservoir. When the mixing process is complete, the mixture or formulation of functional material and compressed fluid is thermodynamically stable/metastable in that the functional material is dissolved or dispersed within the compressed fluid in such a fashion as to be indefinitely contained in the same state as long as the temperature and pressure within the formulation chamber are maintained constant. This state is distinguished from other physical mixtures in that there is no settling, precipitation, and/or agglomeration of functional material particles within the formulation chamber unless the thermodynamic conditions of temperature and pressure within the reservoir are changed. As such, the functional material and compressed fluid mixtures or formulations of the present invention are said to be thermodynamically stable/metastable.

The method for delivering the formulation to a suitable receiver will now be discussed. The apparatus used for delivering the formulation to a suitable receiver has been disclosed in U.S. Pat. No. 6,752,484, which is a Continuation-in-Part of U.S. Pat. No. 6,471,327, which is incorporated here in its entirety. Briefly, the functional material (hole transporting material) is precipitated from the compressed fluid by manipulating and or changing the temperature and/or pressure conditions. The precipitated functional material is directed towards the receiver as a suitable shaped stream. The compressed fluid containing the functional material will be expanded through a suitable orifice into an ambient atmosphere where the compressed fluid will become a gas. The functional material will begin to precipitate non-reactively into particles and/or agglomerates of particles with the dispersant and/or surfactant coating the surfaces of these particles and/or agglomerates thereby limiting the growth of particles. The precipitated and/or aggregated functional material, free of compressed fluid, is deposited on a receiver in a precise and accurate fashion to form a desired image. Thus, upon deposition to the receiver the functional material will have formed a solid film free of the compressed fluid. Hence the receiver is instantaneously dry upon delivery of the functional material on the receiver. The desired image can be formed on a receiver that is not prepatterned, where the deposition would occur on an already fabricated image. Or, in the case of a display device the compressed fluid composition can form the desired image over the prefabricated pixels of the device as is standard in display manufacturing.

The receiver can be any solid including an organic, an inorganic, a metallo-organic, a metallic, an alloy, a ceramic, a synthetic and/or natural polymeric, a gel, a glass, and a composite material. The receiver can be porous or non-porous.

The size of the precipitated nanomaterials can be controlled by the ratio of functional material to dispersant and/or surfactant. The size of the precipitated nanomaterials can be controlled by the depressurization step through suitable orifice design and optimization with temperature of solution, pressure of solution, flow rate of solution, and concentrations of the functional materials, more specifically, hole transporting materials, and dispersant and/or surfactants. The size of the precipitated nanomaterials can be controlled by the appropriate selection of dispersant and/or surfactant material such as the type of functional groups on the molecule as well as the solubility in the particular compressed liquid and/or supercritical fluid. Typical particle size of the functional material deposited on the receiver is in the range of 1 nanometer to 1000 nanometers. More preferably, the particle size of the functional material is in the range of 1 nanometer to 100 nanometers.

The precipitated nanomaterial can also be collected by any number of methods. For example, the precipitated nanomaterials may be injected into/onto a suitable substrate sheet for immobilization or the nanomaterials may be collected in a suitable liquid. Due to the surfactant coating of the nanomaterials during the depressurization process, the nanomaterials will be stable and not undergo significant agglomeration. Thereby, discrete nanoparticles can be obtained depending on the processing conditions.

It is to be understood that elements not specifically shown or described may take various forms well known to those skilled in the art. Additionally, materials identified as suitable for various facets of the invention, for example, functional materials, more specifically, hole transporting materials, are to be treated as exemplary, and are not intended to limit the scope of the invention in any manner.

EXAMPLES

Example 1

Preparation of Compressed Fluid Formulation Containing PVK, a Polymeric Hole Transporting Material 0.1 g of powder PVK dissolved in Tetrahydrofuran as a 5 weight % solution, and 200 g of $CO_2$ were placed in a high pressure cell at 60° C. and at 300 atm and mixed sufficiently by agitation. After an appropriate time, the system was visibly homogeneous. The formulation was expanded to ambient condition through a needle valve for 5 seconds to deposit PVK on a glass substrate that produced a film, which was instantly dry, by appearance.

Figure 2:
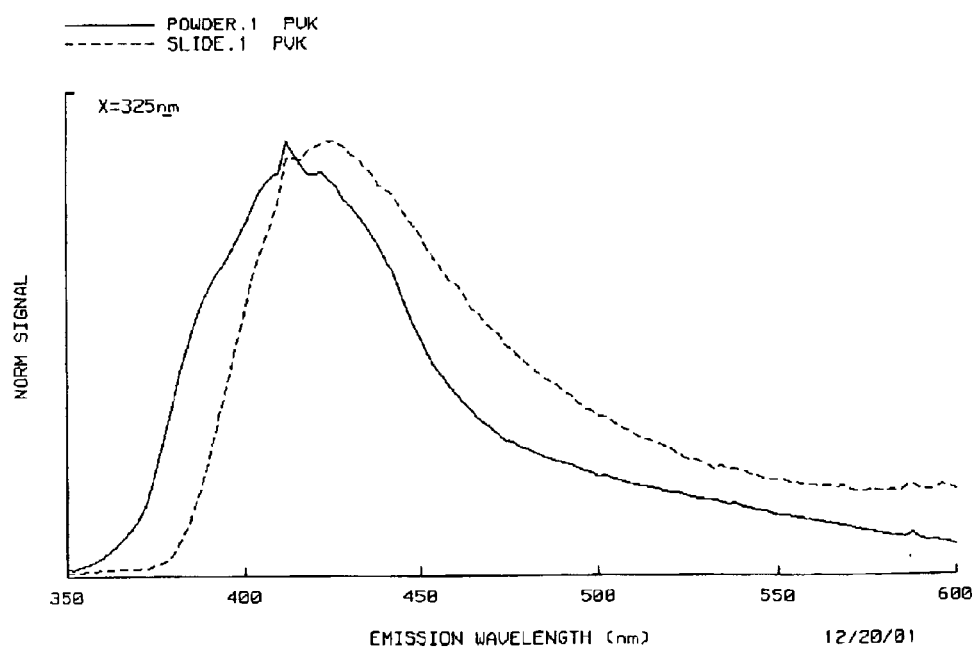
FIG. 2 is a graph of the luminescence spectra of poly (vinylcarbazole) powder and a poly(vinylcarbazole) film produced using a formulation composition of this invention.

FIG. 2 shows the luminescence spectra of PVK powder used in the formulation and a film produced using the formulation of Example 1. It is evident that the formulation composition produces a suitable luminescent signature corresponding to PVK.

Figure 3:
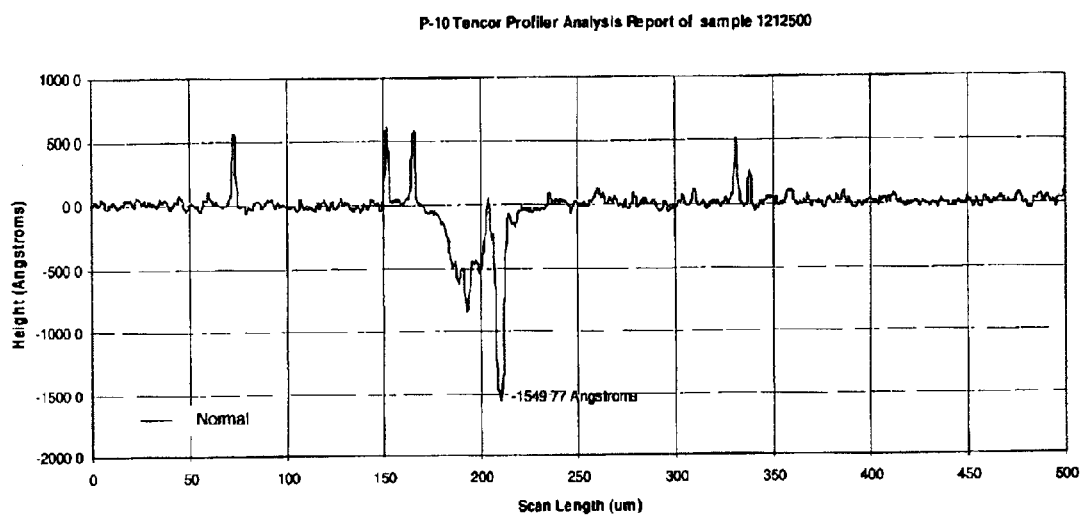
FIG. 3 is a graph of the thickness and surface roughness of a poly(vinylcarbazole) film produced using a formulation composition of this invention.

FIG. 3 is a profilometry graph of a thin film produced with the formulation of Example 1. The graph shows that the thickness of the film deposited is approximately 150 nanometers and has average surface roughness less than 10 nanometers indicating that a film of suitable thickness and quality are produced with the formulation of Example 1.

Example 2

Preparation of a Compressed Fluid Formulation Containing a Small Molecule Hole Transporting Material 0.0056 g of TNB is added to a 30 ml formulation vessel. The vessel is closed and 11.11 g of compressed $CO_2$ is slowly introduced into the vessel. The vessel is heated to 60° C. while stirring its contents and pressure adjusted to 300+/−5 bars. The vessel is held under these conditions for 30 min at the end of which, stirring is stopped. The vessel is held at these conditions for additional 2 min. The vessel contents are rapidly released through a 100-micrometer orifice for nominally 1 second and deposited on the face of a microscopy glass slide kept about 0.55 cm from the orifice. The deposited film was dry upon contact of the glass slide.

Figure 4:
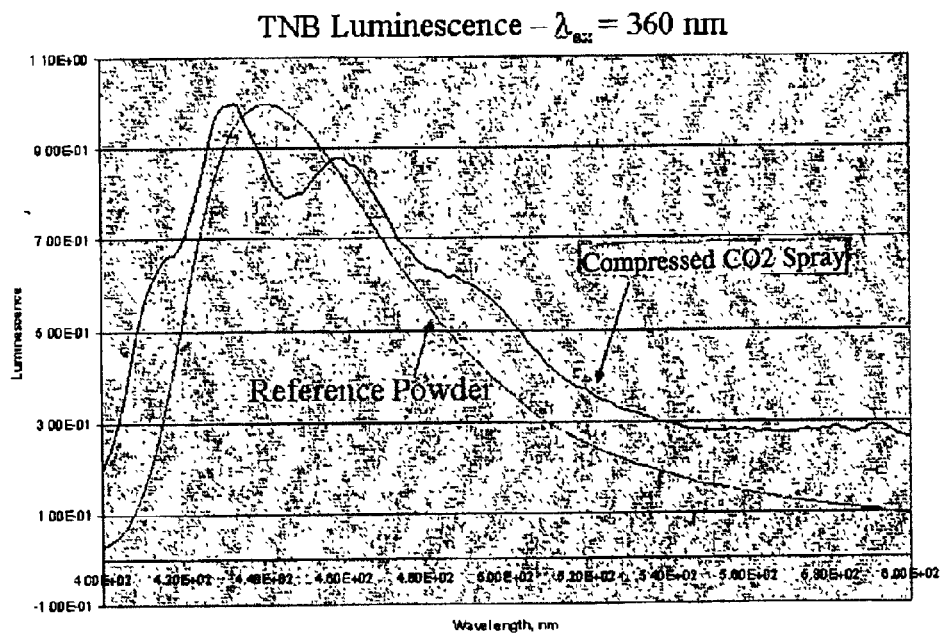
FIG. 4 is a graph of the luminescence spectra of TNB powder and a TNB film produced using a compressed fluid formulation composition of this invention.

FIG. 4 shows the luminescence spectra of TNB powder used in the formulation and a film produced using the formulation of Example 2. It is evident that the compressed fluid formulation composition produces a suitable luminescent signature corresponding to TNB.

What is claimed is:

1. An imaging composition comprising a mixture of a solvent and a functional material;

wherein the solvent is a compressed fluid and the functional material is a hole transporting material which is dissolved, dispersed and/or solubilized in the compressed fluid;

wherein the mixture is thermodynamically stable or thermodynamically metastable or both;

wherein the functional material is solvent-free upon deposition on a substrate; and wherein the functional material forms a solid film upon deposition on the substrate wherein said hole transporting material comprises aromatic tertiary amine comprising

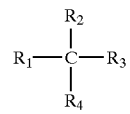

where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula:

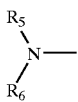

wherein $R_5$ and $R_6$ are independently selected aryl groups.

2. The imaging composition according to claim 1, wherein the composition is capable of forming an image on a non-prepatterned surface.

3. The imaging composition according to claim 1, wherein the composition is capable of forming an image on a pre-patterned surface.

4. The imaging composition according to claim 1, wherein the fluid is a compressed liquid.

5. The imaging composition according to claim 1, wherein the fluid is a supercritical fluid.

6. The imaging composition according to claim 1, wherein the fluid is a mixture of compressed liquid and supercritical fluid.

7. The imaging composition according to claim 1, wherein the fluid is selected from the group consisting of carbon dioxide, nitrous oxide, ammonia, xenon, ethane, ethylene, propane, propylene, butane, isobutane, chlorotrifluoromethane, monofluoromethane, and sulphur hexafluoride.

8. The imaging composition according to claim 1, wherein the fluid is carbon dioxide.

9. The imaging composition according to claim 1, wherein the functional material is a solid, or a combination of a solid and liquid.

10. The imaging composition according to claim 1, wherein the functional material is an organic molecule or an inorganic molecule.

11. The imaging composition according to claim 1, wherein the functional material is functionalized.

12. The imaging composition of claim 11, wherein functional groups for functionalization include fluorocarbons, siloxane or hydrocarbon groups.

13. The imaging composition according to claim 1, wherein the functional material is particulate.

14. The imaging composition according to claim 13, wherein the mean particle size of the functional material is between 1 nanometer and 1000 nanometers.

15. The imaging composition according to claim 13, wherein the mean particle size of the functional material is between 1 nanometer and 100 nanometers.

16. The imaging composition of claim 1, further comprising a surfactant, a dispersant, or a co-solvent.

17. The imaging composition of claim 1, wherein on delivery to a substrate, the functional material is free of the compressed fluid and co-solvent.

18. The imaging composition of claim 16, wherein the surfactant is non-fluorinated, partially fluorinated, or fully fluorinated.

19. The imaging composition of claim 16, wherein the surfactant is a perfluoropolyether, or a siloxane surfactant.

20. The imaging composition of claim 16, wherein the ratio of surfactant to functional material is from about 0.1:1 to about 500:1.

21. The imaging composition of claim 16, wherein the ratio of surfactant to functional material is from about 0.1:1 to about 100:1.

22. The imaging composition of claim 16, wherein the ratio of surfactant to functional material is from about 0.1:1 to about 50:1.

23. The imaging composition of claim 16, wherein the ratio of co-solvent to functional material is from about 0.01:1 to about 100:1.

24. The imaging composition of claim 1, wherein the ratio of compressed fluid to functional material is from about $1:1\times10^{-5}$ to about 1:20.

25. The imaging composition of claim 1, wherein the ratio of compressed fluid to functional material is from about $1:1\times10^{-3}$ to about 1:10.

26. The imaging composition of claim 1 wherein at least one of $R_5$ or $R_6$ contains a polycyclic fused ring structure.

* * * * *